(12) United States Patent
Liu et al.

(10) Patent No.: US 12,113,156 B2
(45) Date of Patent: Oct. 8, 2024

(54) RADIATION-EMITTING DEVICE

(71) Applicant: Osram Opto Semiconductors GmbH, Regensburg (DE)

(72) Inventors: Tomin Liu, Kuching (MY); T'ing Qi'ao Leow, Pulau Pinang (MY); Keng Chong Lim, George Town (MY)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 462 days.

(21) Appl. No.: 17/609,801

(22) PCT Filed: May 9, 2019

(86) PCT No.: PCT/EP2019/061943
§ 371 (c)(1),
(2) Date: Nov. 9, 2021

(87) PCT Pub. No.: WO2020/224787
PCT Pub. Date: Nov. 12, 2020

(65) Prior Publication Data
US 2022/0238765 A1 Jul. 28, 2022

(51) Int. Cl.
*H01L 33/50* (2010.01)
*C09K 11/77* (2006.01)
*G02B 5/20* (2006.01)
*B82Y 30/00* (2011.01)

(52) U.S. Cl.
CPC ........ *H01L 33/504* (2013.01); *C09K 11/7705* (2013.01); *C09K 11/77068* (2021.01); *G02B 5/208* (2013.01); *B82Y 30/00* (2013.01)

(58) Field of Classification Search
CPC .............. H01L 33/504; C09K 11/7705; C09K 11/77068; C09K 11/06; C09K 11/7773; G02B 5/208; B82Y 30/00
See application file for complete search history.

(56) References Cited

U.S. PATENT DOCUMENTS

| | | | |
|---|---|---|---|
| 2002/0045190 A1* | 4/2002 | Wilson, Jr. ........... | B01J 19/0046 435/7.1 |
| 2010/0301739 A1* | 12/2010 | Nakamura .......... | C04B 35/6268 313/503 |
| 2011/0089458 A1* | 4/2011 | Hartmann ............ | H01L 33/504 257/E33.001 |

(Continued)

OTHER PUBLICATIONS

International Search Report issued for the corresponding PCT application No. PCT/EP2019/061943, dated Nov. 8, 2019, 3 pages (for informational purposes only).

(Continued)

*Primary Examiner* — S M Sohel Imtiaz
(74) *Attorney, Agent, or Firm* — Viering, Jentschura & Partner mbB (57) ABSTRACT

A radiation-emitting device may include a radiation-emitting semiconductor chip configured to emit electromagnetic radiation of a first wavelength range from a radiation exit surface, a first phosphor configured to convert electromagnetic radiation of the first wavelength range into electromagnetic radiation of a second wavelength range. The second wavelength range may be or include infrared light. The device may further include an up-converting phosphor configured to convert infrared light of the second wavelength range into visible light.

17 Claims, 6 Drawing Sheets

(56) References Cited

U.S. PATENT DOCUMENTS

| | | | | |
|---|---|---|---|---|
| 2012/0001204 A1* | 1/2012 | Jagt | ............... | H01L 33/504 |
| | | | | 359/326 |
| 2016/0168459 A1* | 6/2016 | Cohen | ............ | C09K 11/7773 |
| | | | | 252/301.4 H |
| 2016/0329470 A1* | 11/2016 | Butendeich | ............ | F21V 9/38 |
| 2017/0222100 A1* | 8/2017 | David | ............ | H01L 33/486 |
| 2019/0099505 A1* | 4/2019 | Han | ............ | A61K 49/0067 |
| 2019/0113207 A1* | 4/2019 | Palmer | ............ | G02B 5/223 |

OTHER PUBLICATIONS

Wu, Xiang et al., "Tailoring Dye-sensitized Upconversion Nanoparticles Excitation Bands towards Excitation Wavelength Selective Imaging", Nanoscale, Oct. 2015, 6 pages, vol. 7, Issue 44.

* cited by examiner

RADIATION-EMITTING DEVICE

CROSS-REFERENCE TO RELATED APPLICATIONS

The present application is a national stage entry according to 35 U.S.C. § 371 of PCT Application No. PCT/EP2019/061943 filed on May 9, 2019, which is incorporated herein by reference in its entirety and for all purposes.

TECHNICAL FIELD

A radiation-emitting device is provided.

BACKGROUND

A radiation-emitting device with enhanced brightness is to be provided. In particular, a radiation-emitting device emitting white light with a high color rendering index (CRI) having enhanced brightness is to be provided.

SUMMARY

According to an embodiment, the radiation-emitting device comprises a radiation-emitting semiconductor chip. The semiconductor chip emits electromagnetic radiation of a first wavelength range from a radiation exit surface.

According to an embodiment of the radiation-emitting device, the semiconductor chip comprises a semiconductor layer sequence with an active zone generating the electromagnetic radiation of the first wavelength range emitted by the semiconductor chip.

In a non-limiting embodiment, the semiconductor layer sequence is based on a III/V compound semiconductor material, such as a nitride compound semiconductor material. Nitride compound semiconductor materials are compound semiconductor materials containing nitrogen, such as the materials from the system $In_xAl_yGa_{1-x-y}N$ with $0 \leq x \leq 1$, $0 \leq y \leq 1$ and $x+y \leq 1$. A semiconductor layer sequence based on a nitride compound semiconductor material has as a rule an active zone generating blue light during operation.

According to a further embodiment, the radiation-emitting device comprises a first phosphor. The first phosphor converts electromagnetic radiation of the first wavelength range into electromagnetic radiation of a second wavelength range. In a non-limiting embodiment, the second wavelength range and the first wavelength range are different from each other. In other words, the first phosphor converts electromagnetic radiation emitted by the semiconductor chip in electromagnetic radiation of the second wavelength range.

The first phosphor has, in other words, wavelength converting properties. With the term "wavelength converting" it is particularly meant that electromagnetic radiation of a certain wavelength range, such as the first wavelength range, is converted into electromagnetic radiation of a different wavelength range, such as the second wavelength range.

As a rule, a wavelength converting element absorbs incident electromagnetic radiation of an excitation wavelength range, converts the absorbed electromagnetic radiation into a different wavelength range by electronic processes on atomic or molecular level and reemits the converted electromagnetic radiation. In the case that the wavelength range of the converted radiation has longer wavelengths than the absorbed electromagnetic radiation, the wavelength converting element is a down-converting wavelength converting element. In the case that the converted wavelength range comprises shorter wavelengths than the absorbed electromagnetic radiation the wavelength converting element is a so-called up-converting wavelength converting element.

The wavelength converting element, such as a phosphor, comprises, for example, a crystalline host lattice, such as a ceramic lattice, which is doped with activator ions of at least a first type. The crystalline host lattice changes the electronic structure of the activator ion in such a way that electromagnetic radiation of a excitation wavelength range is absorbed in the material and excites an electronic transition in the phosphor, which returns to the ground state by emitting converted electromagnetic radiation of the second wavelength range. The down-converting phosphor comprises only a single type of activator ions, while the up-converting phosphor comprises at least two different types of activator ions enabling multi-photon processes.

In a non-limiting embodiment, the second wavelength range of the electromagnetic radiation has longer wavelengths than the first wavelength range. Furthermore, the second wavelength range comprises infrared light. The infrared light of the second wavelength range has electromagnetic radiation with a wavelength of at least 710 nanometer, such as at least 760 nanometer. An upper limit of the infrared electromagnetic radiation and its wavelength is, for example, 900 nanometer, inclusive the limit.

According to a further embodiment, the radiation-emitting device comprises an up-converting phosphor converting infrared light of the second wavelength range into visible light. In other words, the up-converting phosphor converts electromagnetic radiation already converted by the first phosphor into infrared light of the second wavelength range into visible light, such as into yellow to green light. In such a way the brightness of the radiation-emitting device can be enhanced, since infrared light is not visible to the human eye.

According to a non-limiting embodiment, the radiation-emitting device comprises a radiation-emitting semiconductor chip, emitting electromagnetic radiation of a first wavelength range from a radiation exit surface, a first phosphor converting electromagnetic radiation of the first wavelength range into electromagnetic radiation of the second wavelength range, said second wavelength range comprising infrared light and an up-converting phosphor converting infrared light of the second wavelength range into visible light.

According to a further embodiment of the radiation-emitting device, the up-converting phosphor comprises up-converting nanoparticles or is embodied as up-converting nanoparticles.

According to a non-limiting embodiment of the radiation-emitting device, the up-converting nanoparticles comprise β-NaYF$_4$ doped with lanthanoids or consist of β-NaYF$_4$ doped with lanthanoids. The lanthanoids suited as activator ions for doping the β-NaYF$_4$ are, for example, $Yb^{3+}$, $Er^{3+}$, $Nd^{3+}$.

In a non-limiting embodiment, the up-converting nanoparticles comprise or consist of β-NaYF$_4$ doped with $Yb^{3+}$ and $Er^{3+}$ as activator ions. For example, the $Yb^{3+}$ content lies between 17 Mol % and 23 Mol %, inclusive the limits. For example, the $Er^{3+}$ content lies between 1.5 Mol % and 2.5 Mol %, inclusive the limits. For example, the up-converting nanoparticles comprise or consists of β-NaYF4: 20% Yb, 2% $Er^{3+}$.

According to a further embodiment of the radiation-emitting device, the up-converting nanoparticles of the up-converting phosphor are coated with an organic dye. In a non-limiting embodiment, the organic dye covers the up-converting nanoparticle completely. For example, the organic dye forms a monolayer on the up-converting nanoparticle.

In a non-limiting embodiment, the organic dye has in general also wavelength converting properties. In a non-limiting embodiment, the organic dye converts for example in solution electromagnetic radiation of the infrared light of the second wavelength range into electromagnetic radiation with longer infrared wavelengths. However, at present the organic dye absorbs electromagnetic radiation such that electronic states are excited within the organic dye. However, due to the presence of the underlying up-converting nanoparticle, the energy of the excited electronic state is transferred to the underlying up-converting nanoparticle by non-radiative processes such as a dipole-dipole coupling ("Foerster resonance energy transfer", FRET).

For example, the organic dye absorbs infrared electromagnetic radiation of the first wavelength range and transfers the energy of the electronic state excited by the absorbed electromagnetic radiation to the up-converting nanoparticle by a non-radiative dipole-dipole coupling ("Foerster resonance energy transfer", FRET). For example, one of the following materials is suited as organic dye: IR-783, IR-808, IR-820, IR-845.

With the help of the organic dye, a wider range of infrared electromagnetic radiation can be converted compared to the bare up-converting nanoparticle. Up-converting nanoparticles covered with an organic dye are, for example, described in the document "Tailoring Dye sensitive Upconversion Nanoparticles Excitation Bands towards Excitation Wavelength Selective Imaging", X. Wu et al, Nanoscale, 2015, 7, 18424-18428 (DOI: 10.1039/C5NR05437K), the disclosure content of which is incorporated herein in its entirety.

According to a further embodiment of the radiation-emitting device, the up-converting nanoparticles have a size between 10 nanometer and 100 nanometer, inclusive the limits. In a non-limiting embodiment, the up-converting nanoparticles have a size between 50 nanometer and 25 nanometer, inclusive the limits.

According to a further embodiment of the radiation-emitting device, the radiation-emitting semiconductor chip emits blue light as electromagnetic radiation of the first wavelength range. In a non-limiting embodiment, the first wavelength range comprises wavelength from 410 nanometer to 480 nanometer, inclusive the limits. In a non-limiting embodiment, the electromagnetic radiation of the first wavelength range comprises of wavelength from 410 nanometer to 460 nanometer, inclusive the limits and such as from 420 nanometer to 460 nanometer, inclusive the limits.

According to a further embodiment of the radiation-emitting device, the second wavelength range comprises red light. In a non-limiting embodiment, the second wavelength range consist of the infrared light and the red light. In other words, the first phosphor converts electromagnetic radiation of the first wavelength range into red light besides the infrared light. For example, the red light comprises or consists of electromagnetic radiation with wavelength between 610 nanometer to 710 nanometer, inclusive the limits. In a non-limiting embodiment, the second wavelength range is composed of red light and infrared light. In a non-limiting embodiment, the second wavelength range comprises or consists of a wavelength from 610 nanometer to 900 nanometer, inclusive the limits.

According to a further embodiment of the radiation-emitting device, the first phosphor comprises a nitride doped with rare earth. In a non-limiting embodiment, the first phosphor converts blue light of the semiconductor chip into red light and infrared light. For example, the nitride doped with rare earth has one of the following chemical formulas: $(Ca,Sr,Ba)AlSiN_3:Eu^{2+}$, $(Ca,Sr)AlSiN_3:Eu^{2+}$, $Sr(Ca,Sr)Al_2Si_2N_6:Eu^{2+}$, $M_2Si_5N_8:Eu^{2+}$ with M=Ca, Ba, Sr alone or in combination.

According to a further embodiment of the radiation-emitting device, it comprises a second phosphor converting electromagnetic radiation of the first wavelength range into electromagnetic radiation of a third wavelength range. In a non-limiting embodiment, the third wavelength range is different from the first wavelength range and the second wavelength range. The third wavelength range comprises yellow to green light. For example, the third wavelength range comprises wavelength from 480 nanometer to 610 nanometer, inclusive the limits or consists of wavelength from 480 nanometer to 610 nanometer, inclusive the limits.

For example, the second phosphor comprises a garnet doped with rare earth or consists of a garnet doped with rare earth. For example, the garnet doped with rare earth has one of the following chemical formulas: $(Lu,Y)_3(Al,Ga)_5O_{12}:Ce^{3+}$, $Lu_3Al_5O_{12}:Ce^{3+}$, $Lu_3(Al,Ga)_5O_{12}:Ce^{3+}$, $Y_3Al_5O_{12}:Ce^{3+}$, $Y_3(Al,Ga)_5O_{12}:Ce^{3+}$.

In a non-limiting embodiment, the visible light emitted by the up-converting phosphor is part of the first wavelength range and/or the second wavelength range and/or the third wavelength range.

According to a further embodiment of the radiation-emitting device, the first phosphor and/or the second phosphor are comprised by a conversion element. In a non-limiting embodiment, the conversion element comprises also a resin. For example, the first phosphor and/or the second phosphor are embodied as phosphor particles, which are embedded in the resin. In a non-limiting embodiment, the grain size of the first phosphor and/or the second phosphor particles lies between 1 micrometer and 30 micrometer, inclusive the limits. For example, the resin comprises silicone, epoxy or a mixture of a silicone and an epoxy or consists of silicone, epoxy or a mixture of a silicone and an epoxy. In a non-limiting embodiment, also the up-converting phosphor is comprised by the conversion element. For example, the up-converting phosphor is embodied as up-converting nanoparticles and embedded in the resin. For example, the resin with the phosphor particles is embodied as a casting or a layer. The conversion element embeds the semiconductor chip.

In a non-limiting embodiment, the conversion element comprising the first phosphor and/or the second phosphor and/or the up-converting phosphor does not convert all electromagnetic radiation of the first wavelength range. Rather, a part of the electromagnetic radiation of the first wavelength range transmits the conversion element unconverted.

In such a way a radiation-emitting device can be created emitting mixed electromagnetic radiation with a total emission spectrum composed of electromagnetic radiation of the first wavelength range emitted by the semiconductor chip, of electromagnetic radiation of the second wavelength range emitted by the first phosphor, electromagnetic radiation of the third wavelength range emitted by the second phosphor and the visible light of the up-converting phosphor.

In a non-limiting embodiment, the radiation-emitting chip emits blue light and the conversion element comprises a first phosphor converting a part of the blue light of the semiconductor chip into red to infrared light. Further, the conversion element comprises a second phosphor converting a part of the blue light of the semiconductor chip into yellow to green light. Moreover, the conversion element comprises up-converting nanoparticles converting infrared light emitted by the first phosphor into yellow to green light. Further, a part of the blue light emitted by the semiconductor chip transmits the conversion element unconverted. In such a way, it is with advantage possible to achieve a radiation-emitting device emitting white light with a warm white impression to the human eye.

According to a further embodiment, the radiation-emitting device emits electromagnetic radiation with a white color impression, such as with a warm-white color impression. In a non-limiting embodiment, the correlated color temperature of the electromagnetic radiation of the radiation-emitting device does not exceeding 3300 K.

In a non-limiting embodiment, the electromagnetic radiation of the radiation-emitting device has a color rendering index of at least 70, such as of at least 80.

It is an idea of the present radiation-emitting device to up-convert infrared radiation which is, for example, created by the first phosphor down-converting blue light of the semiconductor chip into red light. In such a way the brightness of the radiation-emitting device can be enhanced.

Further non-limiting embodiments and developments of the radiation emitting device are described in the following in connection with the Figures.

The drawings illustrate exemplary embodiments and, together with the description, serve for explanation thereof. Further exemplary embodiments and many of the intended advantages will become apparent directly from the following detailed description. Equal or similar elements as well as elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

DETAILED DESCRIPTION

Figure 1:
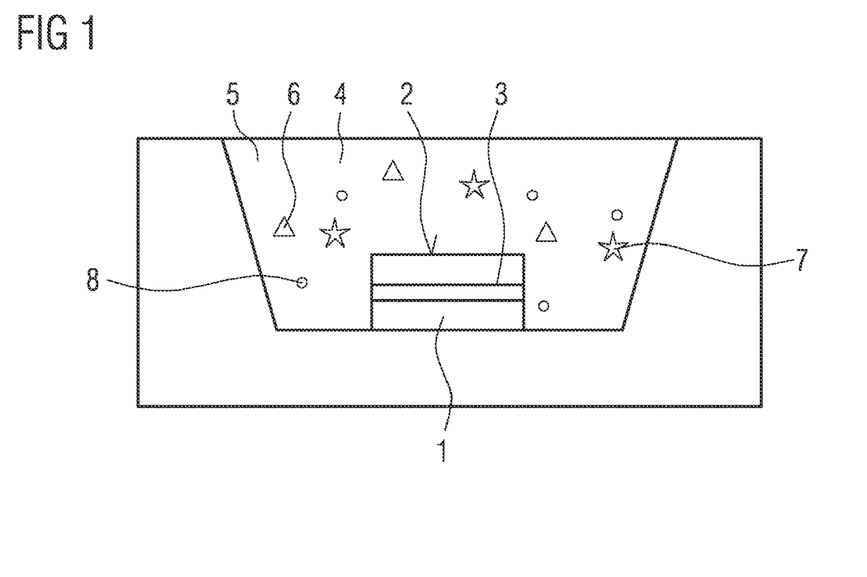
FIG. 1 shows a schematic sectional view of a radiation-emitting device according to an exemplary embodiment.

The radiation-emitting device according to the exemplary embodiment of FIG. 1 comprises a radiation-emitting semiconductor chip 1. The radiation-emitting semiconductor chip 1 emits electromagnetic radiation of a first wavelength range B from a radiation exit surface 2. At present, the semiconductor chip 1 comprises a semiconductor layer sequence with an active zone 3. The semiconductor layer sequence is based on a nitride compound semiconductor material and the active zone 3 generates blue light during operation. The blue light has a peak wavelength within the first wavelength range B consisting of wavelength between 410 nanometer and 480 nanometer.

Furthermore, the radiation-emitting device according to the exemplary embodiment of FIG. 1 comprises a conversion element 4 with a resin 5 such as silicone or an epoxy.

The conversion element 4 comprises a first phosphor 6 embodied as phosphor particles. The first phosphor 6 converts electromagnetic radiation of the first wavelength range B into electromagnetic radiation of a second wavelength range R, which is different from the first wavelength range B. At present, the first phosphor 6 converts electromagnetic radiation of the blue spectral range emitted by the semiconductor chip 1 into the second wavelength range R with red to infrared wavelength. In other words, the second wavelength range R consists at present of wavelengths of the red spectral range and of the infrared spectral range. For example, the second wavelength range R lies between 610 nanometer and 780 nanometer.

For example, a nitride-based material doped with rare earth is suited for the first phosphor 6. In other words, the first phosphor 6 comprises a nitride doped with a rare earth or consists of a nitride doped with rare earth, for example $(Ca,Sr,Ba)AlSiN_3:Eu^{2+}$, $(Ca,Sr)AlSiN_3:Eu^{2+}$, $Sr(Ca,Sr)Al_2Si_2N_6:Eu^{2+}$ or $M_2Si_5N_8:Eu^{2+}$ with M=Ca, Ba, Sr alone or in combination.

Furthermore, the conversion element 4 of the radiation-emitting device of the exemplary embodiment of FIG. 1 comprises a second phosphor 7, said second phosphor 7 converting electromagnetic radiation of the first wavelength B range into electromagnetic radiation of a third wavelength range G. The third wavelength range G is different from the first wavelength range B and the second wavelength range R. At present, the second phosphor 7 converts blue light of the semiconductor chip 1 into yellow to green light. In a non-limiting embodiment, the third wavelength range G comprises wavelengths between 480 nanometer and 610 nanometer, inclusive. For example, the second phosphor 7 comprises a garnet doped with rare earth or consist of a garnet doped with rare earth, for example $(Lu,Y)_3(Al,Ga)_5O_{12}:Ce^{3+}$, $Lu_3Al_5O_{12}:Ce^{3+}$, $Lu_3(Al,Ga)_5O_{12}:Ce^{3+}$, $Y_3Al_5O_{12}:Ce^{3+}$, $Y_3(Al,Ga)_5O_{12}:Ce^{3+}$.

Also, an up-converting phosphor 8 is comprised by the conversion element 4 of the radiation-emitting device of the exemplary embodiment of FIG. 1. The up-converting phosphor 8 converts infrared light of the second wavelength range R into visible light. At present, the up-converting phosphor 8 is embodied as up-converting nanoparticles. The up-converting nanoparticles comprise or consist of $\beta$-$NaYF_4$:20% $Yb^{3+}$, 2% $Er^{3+}$ in the present embodiment.

Figure 2:
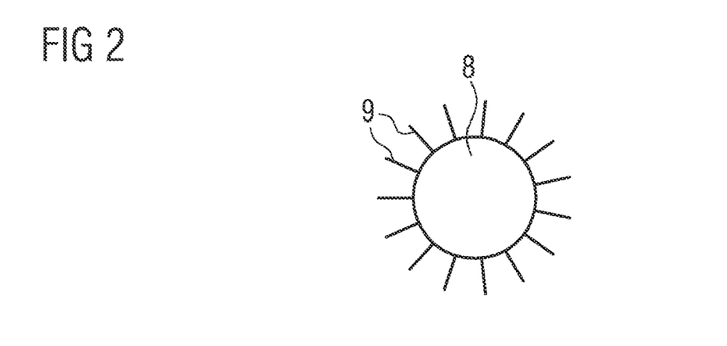
FIG. 2 shows a schematic sectional view of an up-converting nanoparticle comprised by the radiation-emitting device according to the exemplary embodiment of FIG. 1.

A single up-converting nanoparticle 8 of the radiation-emitting device according to the exemplary embodiment of FIG. 1 is schematically shown in FIG. 2. The up-converting nanoparticle 8 of FIG. 2 is covered with a layer of an organic dye 9 such as IR-783, IR-808, IR-820 or IR-845. The organic dye 9 on the surface of the up-converting nanoparticle 8 absorbs electromagnetic radiation of an absorption wavelength range from the infrared spectral range such that an electronic state is excited with the organic dye. The energy of the electronic state is transferred to the underlying up-converting nanoparticle 8, for example by a non-radiative Foerster transfer. Then, the up-converting nanoparticle 8 up-converts the energy transferred by the organic dye 9 into electromagnetic radiation of the visible range. Advantageously, it is possible to design the organic dye 9 in such a way as to generate different absorption wavelengths.

Figure 3:
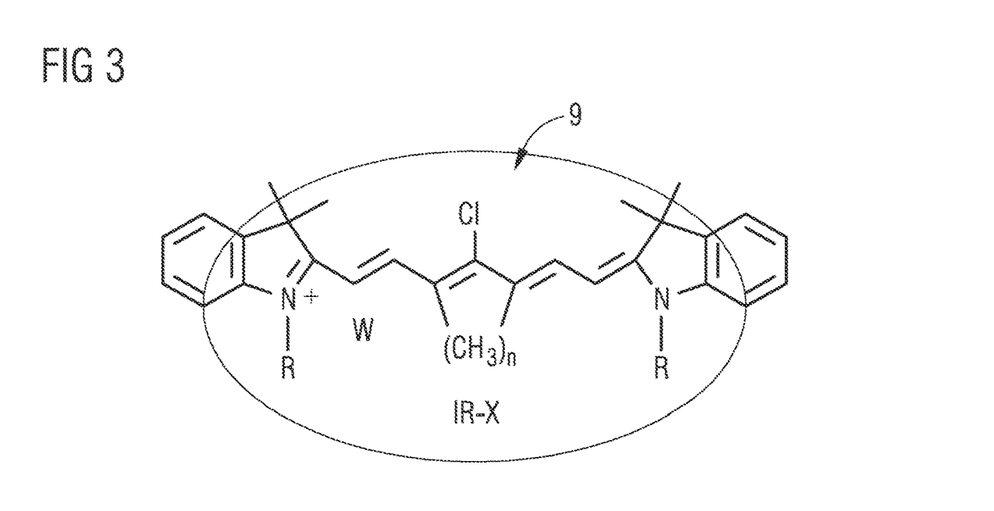
FIGS. 3 to 6 each show schematic chemical structural formulas of an organic dye, which may cover the up-converting nanoparticle of FIG. 2.

The basic structure IR-X of the organic dye 9 is schematically shown in FIG. 3. By modifying the chemical structural formula, for example by different residues for R, different absorption characteristics of the organic dye 9 can be achieved.

Figure 4:
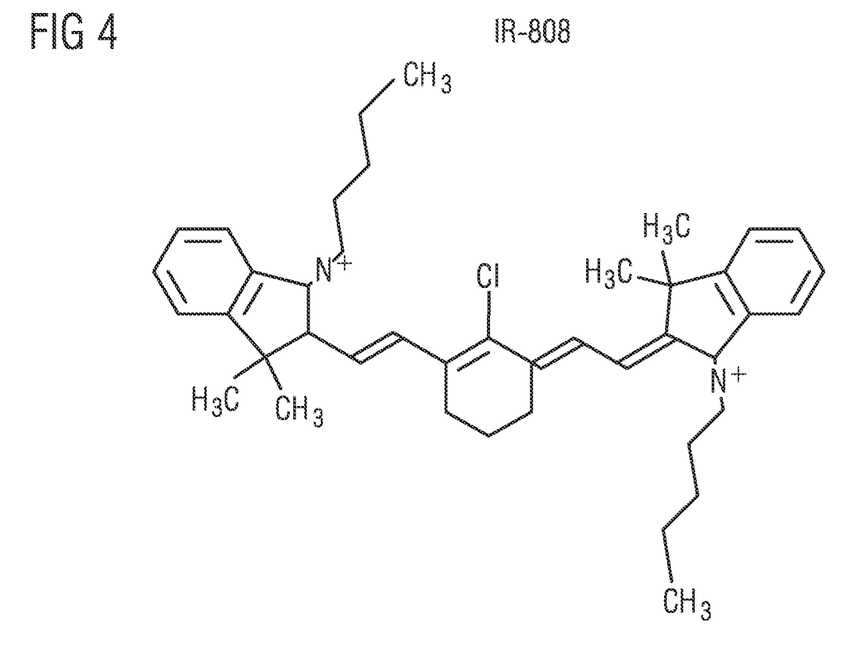

FIG. 4 exemplarily shows schematically the chemical structural formula of the organic dye 9 designated by IR-808 absorbing infrared radiation of a wavelength of about 808 nanometer.

Figure 5:
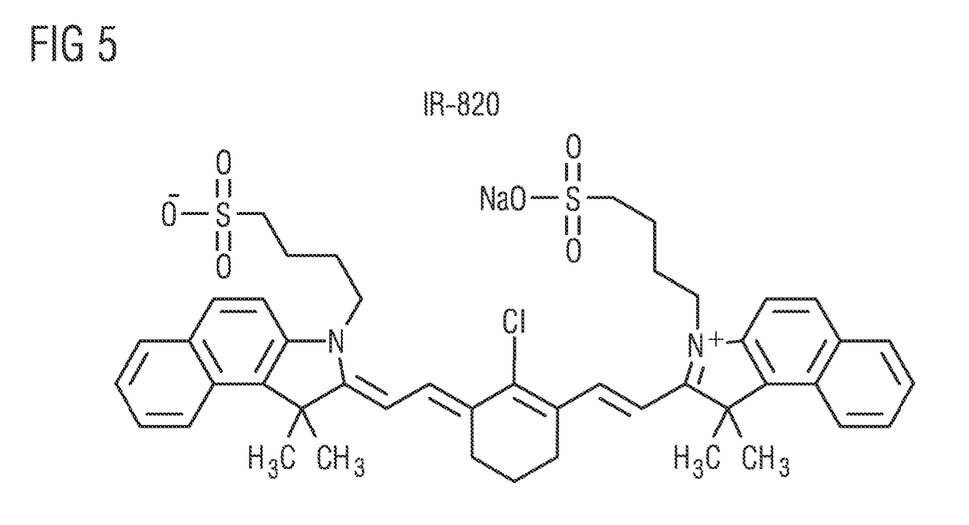

Furthermore, FIG. 5 schematically shows the chemical structural formula of the organic dye 9 designated by IR-820 absorbing a wavelength of about 820 nanometer.

Figure 6:
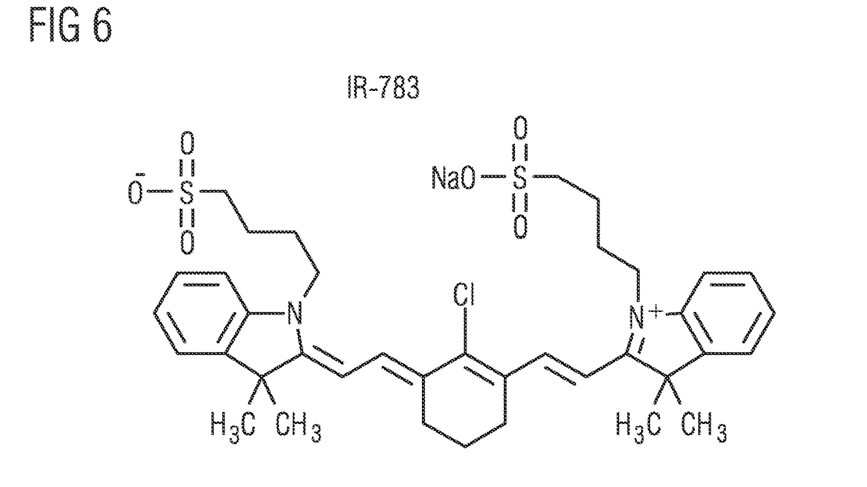

Furthermore, FIG. 6 shows schematically the chemical structural formula of the organic dye 9 designated by IR-783 absorbing infrared radiation of a wavelength of about 783 nanometer.

Figure 7:
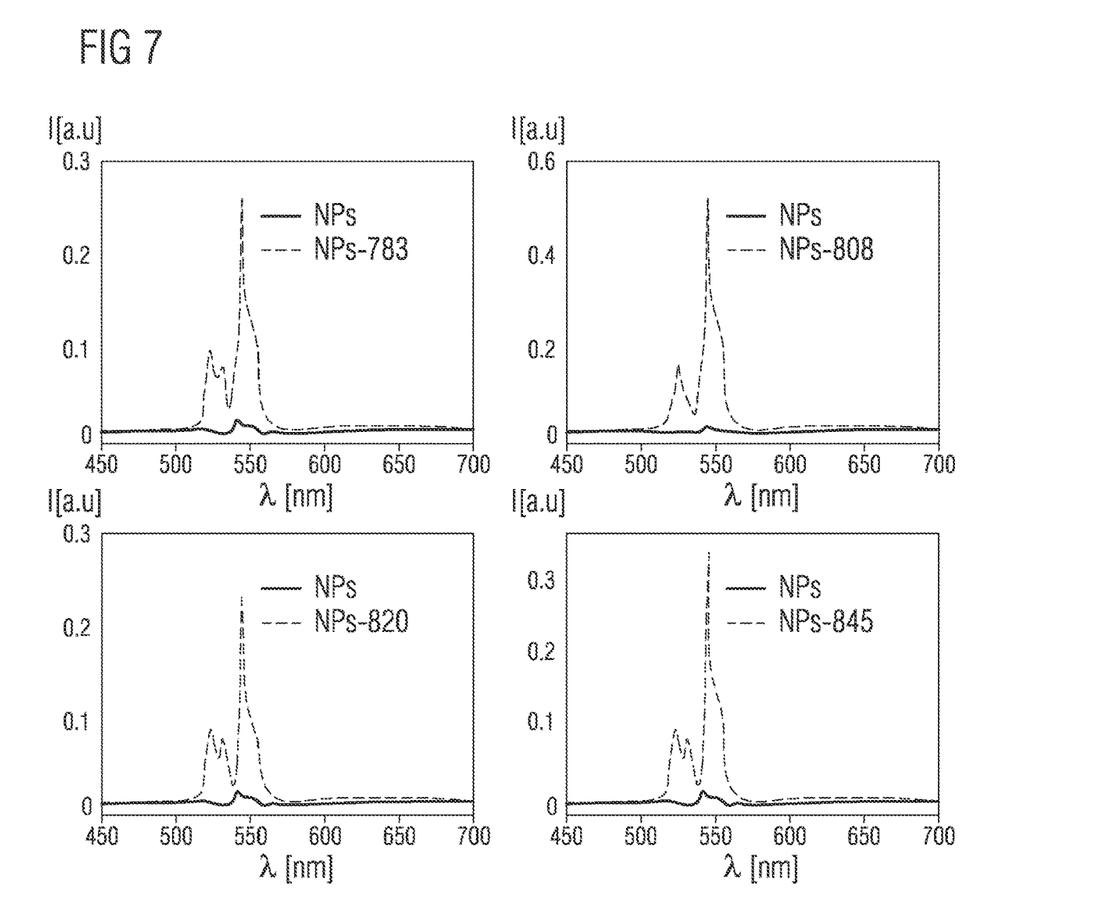
FIG. 7 exemplarily shows the comparison of the emission spectrum of bare up-converting nanoparticles and the emission spectrum of up-converting nanoparticles coated with different organic dyes.

FIG. 7 shows measured values of the photoluminescence intensity I in arbitrary units in dependence of the wavelength $\lambda$ in nanometer of pure up-converting nanoparticles 8 (continuous line) and of up-converting nanoparticles 8 covered with an organic dye 9 (dashed line).

The diagram in the top left corner of FIG. 7 shows the photoluminescence intensity I of pure up-converting nanoparticles 8 and up-converting nanoparticles 8 covered with a layer of IR-783 as organic dye 9. The bare up-converting nanoparticles 8 are excited with electromagnetic radiation having a wavelength of about 980 nanometer, while the up-converting nanoparticles 8 covered with the organic dye 9 called IR-783 were excited with electromagnetic radiation having a wavelength of about 790 nanometer. It can be seen that the photoluminescence of the up-converting nanoparticles 8 covered with the organic dye 9 is significantly enhanced compared to the photoluminescence intensity of the bare up-converting nanoparticles 9.

The diagram in the top right corner of FIG. 7 shows the photoluminescence intensity I of pure up-converting nanoparticles 8 and up-converting nanoparticles 8 covered with a layer of IR-808 as organic dye 9. The bare up-converting nanoparticles 8 are excited with electromagnetic radiation having a wavelength of about 980 nanometer, while the up-converting nanoparticles 8 covered with the organic dye 9 called IR-808 were excited with electromagnetic radiation having a wavelength of about 810 nanometer. It can be seen that the photoluminescence of the up-converting nanoparticles 8 covered with the organic dye 9 is significantly enhanced compared to the photoluminescence intensity of the bare up-converting nanoparticles 8.

The diagram in the bottom left corner of FIG. 7 shows the photoluminescence intensity I of pure up-converting nanoparticles 8 and up-converting nanoparticles 8 covered with a layer of IR-820 as organic dye 9. The bare up-converting nanoparticles 8 are excited with electromagnetic radiation having a wavelength of about 980 nanometer, while the up-converting nanoparticles covered with the organic dye 9 called IR-820 were excited with electromagnetic radiation having a wavelength of about 825 nanometer. It can be seen that the photoluminescence of the up-converting nanoparticles 8 covered with the organic dye 9 is significantly enhanced compared to the photoluminescence intensity of the bare up-converting nanoparticles 8.

The diagram in the bottom right corner of FIG. 7 shows the photoluminescence intensity I of pure up-converting nanoparticles 8 and up-converting nanoparticles 8 covered with a layer of IR-845 as organic dye 9. The bare up-converting nanoparticles 8 are excited with electromagnetic radiation having a wavelength of about 980 nanometer, while the up-converting nanoparticles 8 covered with the organic dye 9 called IR-845 were excited with electromagnetic radiation having a wavelength of about 850 nanometer. It can be seen that the photoluminescence of the up-converting nanoparticles 8 covered with the organic dye 9 is significantly enhanced compared to the photoluminescence intensity of the bare up-converting nanoparticles 8.

Figure 8:
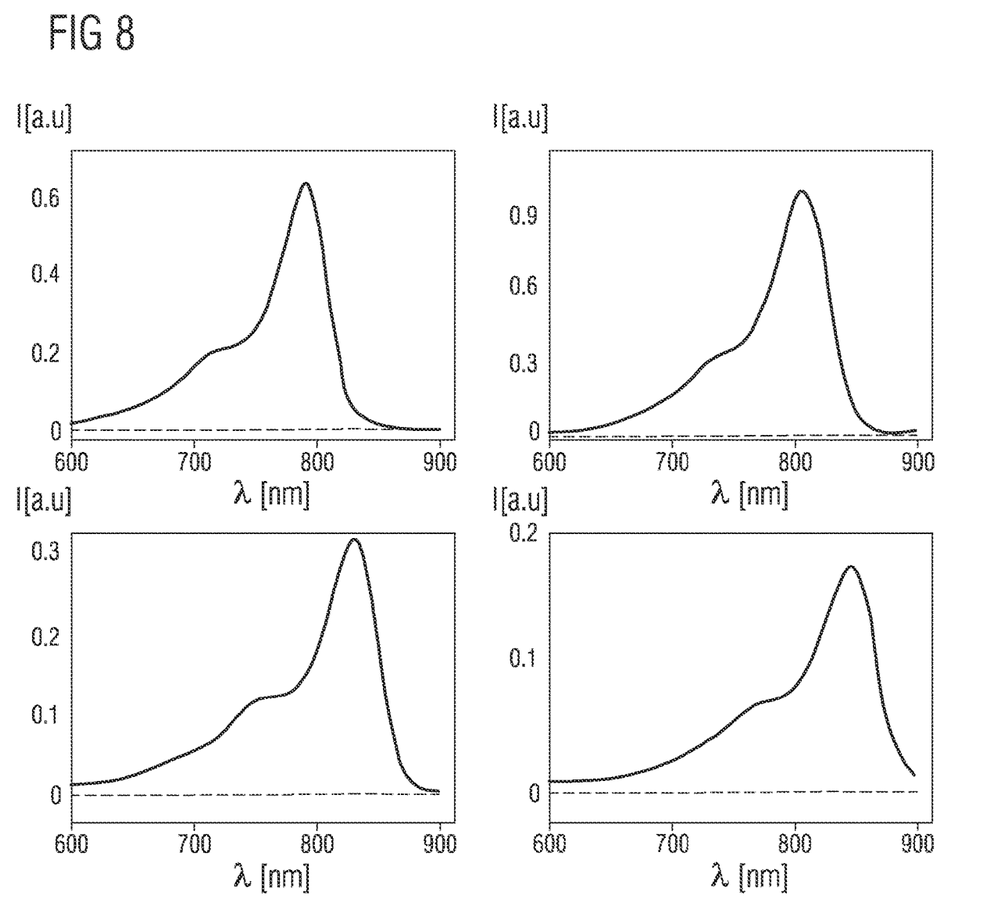
FIG. 8 shows the comparison of the absorption spectrum of organic dyes in a liquid solution and the absorption spectrum of the supernatant of the respective liquid solution.

FIG. 8 shows exemplarily the measured values of absorbed intensity I of electromagnetic radiation in dependence of the wavelength $\lambda$ (absorption spectrum) of solutions with up-converting nanoparticles 8 and different organic dyes 9 (continuous line) together with the measured values of absorbed intensity I of electromagnetic radiation in dependence of the wavelength $\lambda$ of the supernatant of the respective solution after centrifugation (dashed line)

Each solution comprised up-converting nanoparticles 8 with a concentration of about 1 mg/ml and an organic dye 9 with a concentration of about 5 µmol/l.

The diagram in the top left corner of FIG. 8 shows the absorption spectrum of a solution of up-converting nanoparticles 8 and IR-783 as organic dye 9 together with the absorption spectrum of the supernatant of this solution.

The diagram in the top right corner of FIG. 8 shows the absorption spectrum of a solution of up-converting nanoparticles 8 and IR-808 as organic dye 9 together with the absorption spectrum of the supernatant of this solution.

The diagram in the bottom left corner of FIG. 8 shows the absorption spectrum of a solution of up-converting nanoparticles 8 and IR-820 as organic dye 9 together with the absorption spectrum of the supernatant of this solution.

The diagram in the bottom right corner of FIG. 8 shows the absorption spectrum of a solution of up-converting nanoparticles 8 and IR-845 as organic dye 9 together with the absorption spectrum of the supernatant of this solution.

The absorption spectra revealed that the supernatant of each solution did not show noticeable absorption of electromagnetic radiation with wavelength between 600 nanometer and 900 nanometer in contrast to the absorption spectrum of each solution, suggesting that the organic dyes 9 nearly quantitively conjugate on the surface of the up-converting nanoparticles 8.

Figure 9:
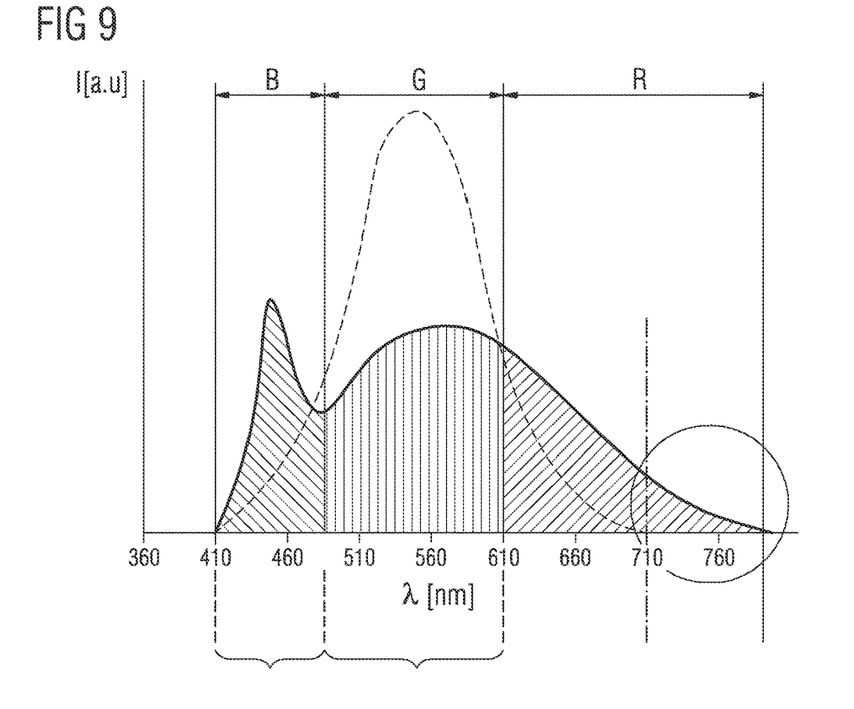
FIG. 9 exemplarily shows the total emission spectrum of a radiation-emitting device without up-converting nanoparticles in a schematic way.

FIG. 9 schematically shows the total emission spectrum (continuous line) of a radiation-emitting device having a semiconductor chip 1 emitting blue light and a conversion element 4. The conversion element 4 comprises a first phosphor 6 converting blue light of the semiconductor chip 1 partially into red to infrared light and a second phosphor 7 converting the blue light of the semiconductor chip 1 partially into yellow to green light. An up-converting phosphor 8 converting infrared light of the second wavelength range R into visible light is not comprised by the radiation-emitting device generating the total emission spectrum of FIG. 9. Further, the conversion element 4 transmits a part of the electromagnetic radiation emitted by the semiconductor chip 1 unconverted. The total emission spectrum is composed of electromagnetic radiation of the first wavelength range B, which is blue light at present, light of the second wavelength range R, which is red to infrared light at present and electromagnetic radiation of the third wavelength range G, which is yellow to green light at present.

For illustration, the spectral sensitivity of the human eye is shown in FIG. 9 as dashed line. It can be seen that the sensitivity of the human eye decreases for electromagnetic radiation with increasing wavelength in the red spectral range. Infrared light with a wavelength above 760 nanometer is not perceived by the human eye.

The first phosphor 6 converts the blue light of the semiconductor chip 1 not only into electromagnetic radiation of the visible red light but also into infrared light with wavelength above 710 nanometer not visible for the human eye. This infrared light does not contribute to the brightness of the radiation-emitting device, since it is not perceived by the human eye.

Figure 10:
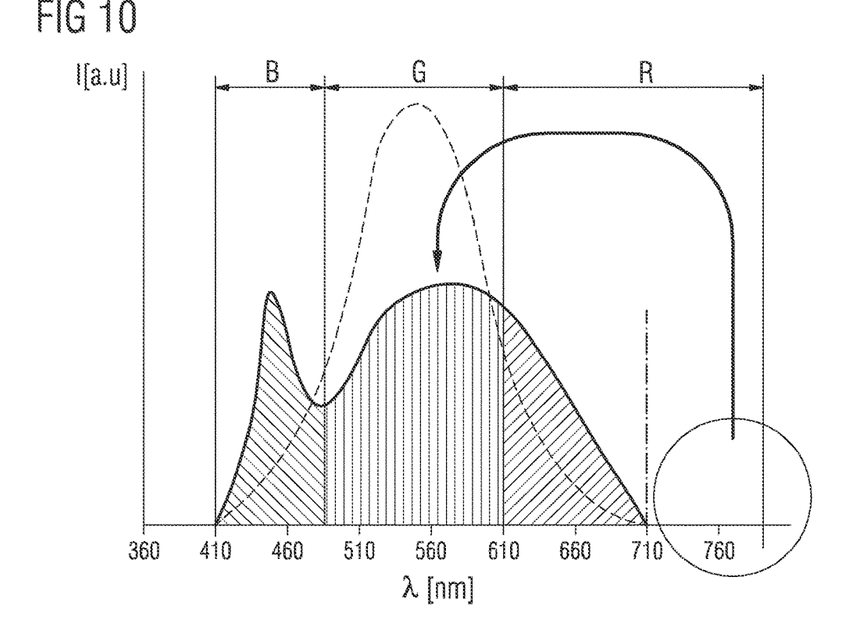
FIG. 10 schematically shows the total emission spectrum of a radiation-emitting device according to an embodiment.

In contrast to the radiation-emitting device generating the total emission spectra of FIG. 9, the radiation-emitting device of FIG. 10 comprises an up-converting phosphor 8. For example, the radiation-emitting device of the exemplary embodiment of FIG. 1 emits the total emission spectrum of FIG. 10.

The up-converting phosphor 8 of the radiation-emitting device converts the infrared light generated by the first phosphor 6 by the conversion of the electromagnetic radiation of the radiation-emitting semiconductor chip 1 into visible light (see the arrow in FIG. 10). At present, the up-converting phosphor 8 converts the infrared light emitted by the first phosphor 6 into visible light of the yellow to green spectral range. In such a way the energy of the infrared light contributes to the light of the radiation-emitting device, which can be perceived by the human eye. In such a way the brightness of the radiation-emitting device of the exemplary embodiment of FIG. 10 is enhanced compared to the brightness of the radiation-emitting device of FIG. 9.

Figure 11:
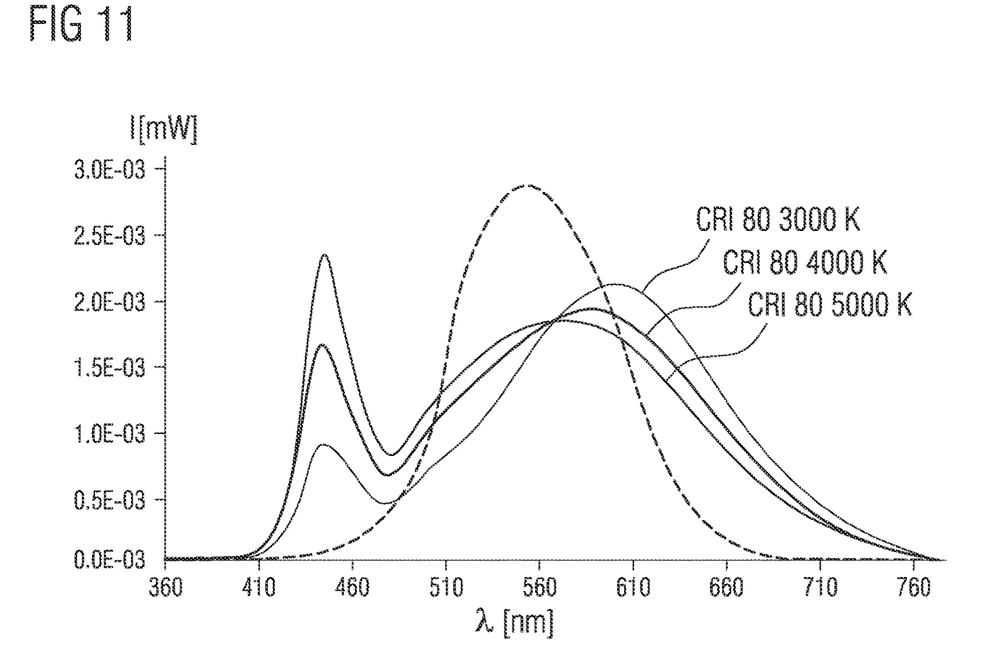
FIG. 11 exemplarily shows the emission spectra of different optoelectronic devices without an up-converting phosphor in a schematic way.

FIG. 11 shows the total emission spectra (continuous lines) of different radiation-emitting devices all being free of an up-converting phosphor 8. Further, the spectral sensitivity of the human eye is shown in FIG. 9 as dashed line for illustration.

By the use of different first phosphors 6 and/or second phosphors 7 as well as by variation of the content of the first phosphor 6 and/or the second phosphor 7 within the conversion element 4, different radiation-emitting devices can be achieved emitting white light with different correlated colour temperatures. At present, the radiation-emitting devices emit white light with a colour rendering index (CRI) of about 80 having correlated colour temperatures of about 3000 K, about 4000 K and about 5000 K. All radiation-emitting devices emit electromagnetic radiation with a total emission spectrum having wavelength in the infrared spectral range above 710 nanometer. Therefore, it can be seen from FIG. 11 that the use of an up-converting phosphor 8 in order to enhance the brightness of the respective radiation-emitting device is particularly advantageous for radiation-emitting devices emitting electromagnetic radiation with a warm white impression.

The invention is not limited to the description of the embodiments. Rather, the invention comprises each new feature as well as each combination of features, particularly each combination of features of the claims, even if the feature or the combination of features itself is not explicitly given in the claims or embodiments.

REFERENCES 1 semiconductor chip
2 radiation exit surface
3 active zone
4 conversion element
5 resin
6 first phosphor
7 second phosphor
8 up-converting phosphor
9 organic dye
B first wavelength range
R second wavelength range
G third wavelength range

The invention claimed is:

1. A radiation-emitting device comprising:
   a radiation-emitting semiconductor chip configured to emit electromagnetic radiation of a first wavelength range from a radiation exit surface;
   a first phosphor configured to convert electromagnetic radiation of the first wavelength range into electromagnetic radiation of a second wavelength range, said second wavelength range comprising infrared light;
   an up-converting phosphor comprising at least two different types of activator ions enabling multi-photon processes, wherein the up-converting phosphor is configured to convert infrared light of the second wavelength range already converted by the first phosphor into visible light.

2. The radiation-emitting device according to claim 1, wherein the up-converting phosphor comprises up-converting nanoparticles.

3. The radiation-emitting device according to claim 2, wherein the up-converting nanoparticles comprise $\beta$-$NaYF_4$ doped with lanthanoids.

4. The radiation-emitting device according to claim 2, wherein the up-converting nanoparticles are coated with an organic dye.

5. The radiation-emitting device according to claim 2, wherein the up-converting nanoparticles have a size ranging from 10 nanometers to 100 nanometers inclusive.

6. The radiation-emitting device according to claim 1, wherein the radiation-emitting semiconductor chip is configured to emit blue light as electromagnetic radiation of the first wavelength range.

7. The radiation-emitting device according to claim 1, wherein the second wavelength range comprises red light.

8. The radiation-emitting device according to claim 1, wherein the first phosphor comprises a nitride doped with a rare earth element.

9. The radiation-emitting device according to claim 8, wherein the nitride doped with the rare earth element has one of the following chemical formulas: $(Ca,Sr,Ba)AlSiN_3$:$Eu^{2+}$, $(Ca,Sr)AlSiN_3$:$Eu^{2+}$, $Sr(Ca,Sr)Al_2Si_2N_6$:$Eu^{2+}$, $M_2Si_5N_8$:$Eu^{2+}$; wherein M is selected from the group consisting of Ca, Ba, Sr, or a combination thereof.

10. The radiation-emitting device according to claim 1, further comprising a second phosphor configured to convert electromagnetic radiation of the first wavelength range into electromagnetic radiation of a third wavelength range, said third wavelength range ranging from yellow to green light.

11. The radiation-emitting device according to claim 10, wherein the second phosphor comprises a garnet doped with a rare earth element.

12. The radiation-emitting device according to claim 11, wherein the garnet doped with the rare earth element has one of the following chemical formulas: $(Lu,Y)_3(Al,Ga)_5O_{12}$:$Ce^{3+}$, $Lu_3Al_5O_{12}$:$Ce^{3+}$, $Lu_3(Al,Ga)_5O_{12}$:$Ce^{3+}$, $Y_3Al_5O_{12}$:$Ce^{3+}$, $Y_3(Al,Ga)_5O_{12}$:$Ce^{3+}$.

13. The radiation-emitting device according to claim 1, wherein the first phosphor and/or a second phosphor are phosphor particles embedded in a resin, said resin comprising up-converting nanoparticles of the up-converting phosphor.

14. The radiation-emitting device according to claim 1, emitting electromagnetic radiation with a color impression in the white spectral range having a color rendering index of at least 70.

15. The radiation-emitting device according to claim 14, wherein the emitted electromagnetic radiation has a warm white color impression.

16. A radiation-emitting device comprising:
- a radiation-emitting semiconductor chip configured to emit electromagnetic radiation of a first wavelength range from a radiation exit surface;
- a first phosphor configured to convert electromagnetic radiation of the first wavelength range into electromagnetic radiation of a second wavelength range, said second wavelength range comprising infrared light;
- an up-converting phosphor configured to convert infrared light of the second wavelength range into visible light, wherein the up-converting phosphor comprises up-converting nanoparticles coated with an organic dye.

17. A radiation-emitting device comprising:
- a radiation-emitting semiconductor chip configured to emit electromagnetic radiation of a first wavelength range from a radiation exit surface;
- a first phosphor configured to convert electromagnetic radiation of the first wavelength range into electromagnetic radiation of a second wavelength range, said second wavelength range comprising infrared light;
- an up-converting phosphor configured to convert infrared light of the second wavelength range into visible light;
- a second phosphor configured to convert electromagnetic radiation of the first wavelength range into electromagnetic radiation of a third wavelength range, said third wavelength range ranging from yellow to green light.

* * * * *